United States Patent [19]

Ingaglio

[11] Patent Number: 4,571,824

[45] Date of Patent: Feb. 25, 1986

[54] REMOVAL TOOL FOR TERMINAL WITH COMPLIANT PINS

[75] Inventor: Michael L. Ingaglio, Pinebrook, N.J.

[73] Assignee: AT&T Bell Laboratories, Murray Hill, N.J.

[21] Appl. No.: 567,368

[22] Filed: Dec. 30, 1983

[51] Int. Cl.[4] .......................... B23P 19/00; H05K 3/30
[52] U.S. Cl. ........................................ 29/764; 29/268
[58] Field of Search ................. 29/762, 764, 741, 268, 29/758

[56] References Cited

U.S. PATENT DOCUMENTS 1,484,222  2/1924  Kightlinger ........................... 29/268

FOREIGN PATENT DOCUMENTS 68660  5/1980  Japan ................................... 29/764

Primary Examiner—Carl E. Hall
Attorney, Agent, or Firm—Alfred G. Steinmetz

[57] ABSTRACT

A terminal removal tool for removing terminals from a printed circuit board, includes a pliers arrangement with special jaws to engage the terminal. Each jaw includes a housing to enclose an end of the terminal and a wedge which is positioned to engage an underside of the terminal when the pliers are closed. The end of the housing rides on the surface of the circuit board to properly position the wedges and when the pliers are closed the action of the wedges breaks the friction fit of the pins holding the terminal to the circuit board.

2 Claims, 5 Drawing Figures

REMOVAL TOOL FOR TERMINAL WITH COMPLIANT PINS

FIELD OF THE INVENTION

This invention relates to terminal removal tools and in particular to a tool for removing terminal devices having compliant pins from a printed circuit board.

BACKGROUND OF THE INVENTION

Many terminal devices that are adapted to be inserted into receptacles in printed circuit boards include compliant prongs or pins that are crimped as the terminal is forced into the receptacle. While the force exerted by the terminal on the receptacle is desirable to secure it to the printed circuit board and secure a good electrical connection, it makes it very difficult to later remove it from the circuit board. To attempt to remove the terminal normally requires grasping it with a pair of pliers and twisting and turning to pluck or wrench it from the circuit board. This is undesirable since not only the terminal but the circuit board itself may be damaged.

BRIEF SUMMARY OF THE INVENTION

A tool for the removal of terminals embodying the principles of the invention includes a pliers with a pair of special jaws to engage and dislodge the terminal from a printed circuit board receptacle. Each jaw opposes the other and each includes a housing to enclose one end of the terminal. Each housing includes a wedge positioned to engage an underside of the terminal, when an end of the jaw is flush with a surface of the circuit board. The pliers are positioned in an open position with the jaw housings on each end of the terminal As the pliers are closed by closing the handles of the pliers the wedges are forced under an underside of the terminal. The action of the wedges gently pulls the pins of the terminal slightly out of their receptacles and breaks the friction connection. The handle of the pliers are gripped and then pulled vertically with the respect to the surface of the printed circuit board to pull the terminal device from the receptacles of the circuit board.

BRIEF DESCRIPTION OF THE DRAWINGS

An understanding of the invention may be attained from the following specification and drawing in which.

DETAILED DESCRIPTION

Figure 1:
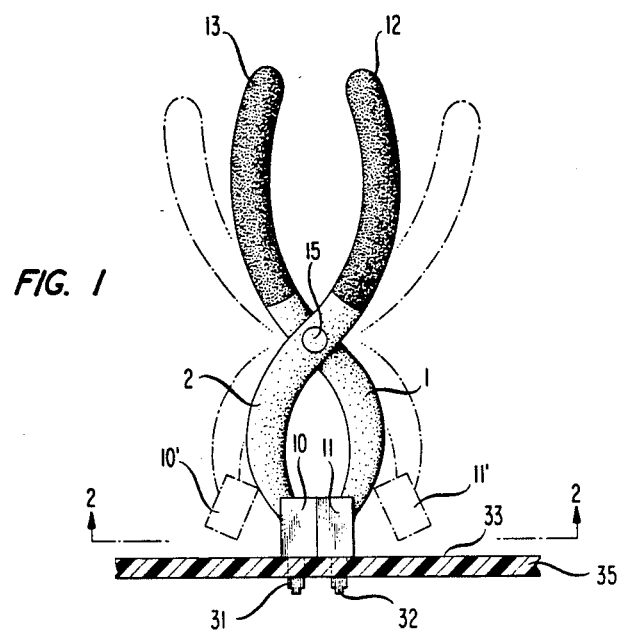
FIG. 1 is a side view of the removal tool engaging a terminal mounted on a printed circuit board.

A side view of the removal tool is shown in FIG. 1 as being in the closed position in which a terminal unit connected to pins 31 and 32 has been engaged for removal purposes by the jaws 10 and 11 facing each other. The open position of the removal tool is shown in a phantom view with the jaws 10' and 11' spaced apart prior to closing and engaging the terminal to be removed. As is apparent from both views of FIG. 1 the flat ends of the jaws 10 and 11 are held contiguous with the flat surface 33 of the printed circuit board 35. The position of the jaws 10 and 11 is controlled by the relative position of the handles 12 and 13 which are each parts of two rigid members 1 and 2 joined at a pivot pin 15 and to which the jaws 10 and 11 are attached and from which the two members form a plier arrangement. Since pliers are well known to those skilled in the art, it is not believed necessary to describe its operation herein. While a pliers with a single pivot pin 15 is disclosed, it is readily apparent that plier arrangements with mechanisms to manipulate the jaws continuously parallel to each other may be advantageously used in this application. Since the mechanics of such a hinge arrangement are well known to those skilled in the art, it is not believed necessary to disclose such an arrangement.

Figure 5:
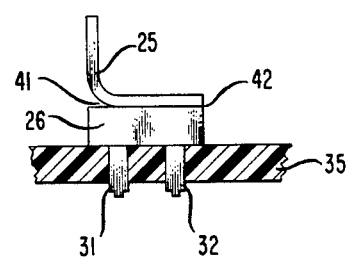
FIG. 5 is a side view of a typical terminal to which the removal tool is to be applied.

A side view of the terminal to be removed is shown in FIG. 5. The top of the terminal 25 is L shaped with one side resting on a circuit package 26. Two compliant terminals 31 and 32 project through the thickness of the circuit package 26 into receptacles of the circuit board 35 shown in cross section. The terminals 31 and 32 are compliant, i.e., spring loaded terminals which are compressed when inserted in a receptacle hole, and hence a great amount of force is necessary to effect their removal.

Figure 2:
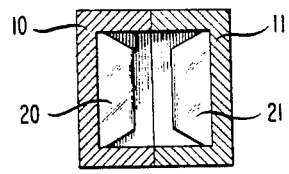
FIG. 2 is a cross section end view of the jaws of the removal tool.
Figure 3:
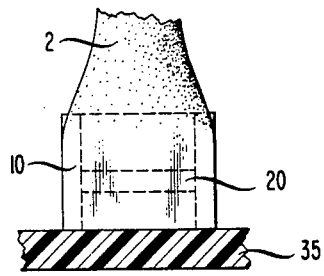
FIG. 3 is a side view of the jaws of the removal tool.
Figure 4:
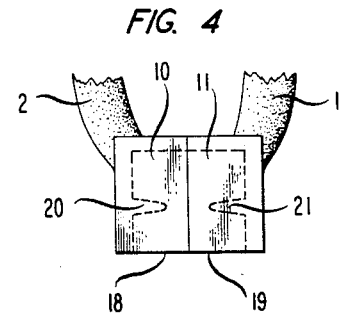
FIG. 4 is another side view of the jaws of the removal tool.

The interior of the jaws is shown in the cross section end view of FIG. 2. Each jaw 10 and 11 includes a transverse cutting wedge 20 and 21 respectively, which spans substantially the entire width of the interior of the jaw housing. These wedges 20 and 21, as shown in dotted form in the side views of FIGS. 3 and 4, are positioned in height from the end faces 18 and 19 of the jaws, so that as these faces slide flush with the surface of the printed circuit board, the wedges 20 and 21 are positioned to engage the underside of the L shaped piece 25 of the terminal setting on top of the circuit package 26 at the exact point as shown by the indicator arrows 41 and 42 in FIG. 5. As the pliers are further closed the wedging action of the wedges goes under the L shaped piece 25 of the terminal and pulls the prongs or pins of the terminal slightly up from the receptacle holes and breaks the friction connection reducing the connection force to a level where the terminal can be readily disengaged from the printed circuit board by pulling directly upward with the pliers.

While a particular embodiment of the invention has been disclosed herein, it is understood that many variations thereof will be apparent to those skilled in the art without departing from the spirit and scope of the invention.

What is claimed is:

1. A tool for removing a terminal device having compliant pins which are mounted with an underside of the terminal device on a receptacle having a known thickness, the receptacle and terminal device being mounted on a printed circuit board, the tool comprising:

a plier assembly having a pair of handles, a pivot mechanism and first and second jaws which move toward one another when the pair of handles is activated, the first and second jaws including:

first and second wedge members, first and second housings, each housing having an end surface that rests on a surface of the printed circuit board and positions the first and second wedge members included within the first and second housings at a proper height equaling the known thickness of the receptacle, said wedges engaging an underside of the terminal device and simultaneously penetrating between the underside of the terminal device and the receptacle on which it rests, thereby, applying a vertical force relative to the surface of the printed circuit board to the underside of the terminal device, and the first and second housing fully enclosing the receptacle and the terminal device when the first and second jaws are closed together.

2. A tool as defined in claim 1 wherein side edges of the first and second wedge members are tapered so that a leading edge is narrower than its opposite edge secured to the first and second housing, respectively.

* * * * *